(12) United States Patent
Keser et al.

(10) Patent No.: US 9,806,048 B2
(45) Date of Patent: Oct. 31, 2017

(54) PLANAR FAN-OUT WAFER LEVEL PACKAGING

(71) Applicant: QUALCOMM Incorporated, San Diego, CA (US)

(72) Inventors: Lizabeth Ann Keser, San Diego, CA (US); David Fraser Rae, San Diego, CA (US); Reynante Tamunan Alvarado, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 41 days.

(21) Appl. No.: 15/072,315

(22) Filed: Mar. 16, 2016

(65) Prior Publication Data

US 2017/0271289 A1 Sep. 21, 2017

(51) Int. Cl.
*H01L 23/29* (2006.01)
*H01L 23/00* (2006.01)
*H01L 23/31* (2006.01)
*H01L 21/56* (2006.01)

(52) U.S. Cl.
CPC ............ *H01L 24/14* (2013.01); *H01L 21/565* (2013.01); *H01L 21/568* (2013.01); *H01L 23/293* (2013.01); *H01L 23/3135* (2013.01); *H01L 24/11* (2013.01); *H01L 2224/0231* (2013.01); *H01L 2224/02379* (2013.01); *H01L 2224/12105* (2013.01); *H01L 2224/13014* (2013.01); *H01L 2224/13016* (2013.01); *H01L 2224/13024* (2013.01); *H01L 2224/13147* (2013.01); *H01L 2924/01047* (2013.01)

(58) Field of Classification Search
CPC ....... H01L 2924/1815; H01L 2924/181; H01L 2224/49171; H05K 1/144
See application file for complete search history.

(56) References Cited

U.S. PATENT DOCUMENTS

| 7,989,950 | B2 | 8/2011 | Park et al. |
| 8,034,667 | B2 | 10/2011 | Shinoda et al. |
| 8,409,920 | B2* | 4/2013 | Pendse .................... H01L 21/56 257/686 |
| 8,970,024 | B2* | 3/2015 | Hsu ..................... H01L 23/3128 257/686 |

(Continued)

FOREIGN PATENT DOCUMENTS

WO 2010044771 A1 4/2010

*Primary Examiner* — Dung Le
(74) *Attorney, Agent, or Firm* — Muncy, Geissler, Olds & Lowe

(57) ABSTRACT

A proposed device may reduce or eliminate a step between a die and a mold compound. Bottom and top surfaces of the die may respectively be the active and non-active sides of the die. The mold compound maybe above the top surface of the die in a fan-in area corresponding to a lateral width of the die and may also be in a fan-out area corresponding to an area that extends laterally away from a side surface of the die. The mold compound in the fan-in area need not be coplanar with the mold compound in at least a portion of the fan-out area. The device may also include a redistribution layer below the bottom surface of the die and below the mold compound, and may further include an interconnect below the redistribution layer and electrically coupled to the die through the redistribution layer. A portion of the redistribution layer may be in the fan-out area.

23 Claims, 8 Drawing Sheets

(56) References Cited

U.S. PATENT DOCUMENTS

| | | | |
|---|---|---|---|
| 9,362,161 B2* | 6/2016 | Chi | H01L 23/528 |
| 2008/0119015 A1* | 5/2008 | Mangrum | H01L 23/522 |
| | | | 438/124 |
| 2012/0286411 A1 | 11/2012 | Watanabe et al. | |
| 2014/0264946 A1* | 9/2014 | Kim | H01L 25/0657 |
| | | | 257/777 |

* cited by examiner

PLANAR FAN-OUT WAFER LEVEL PACKAGING

FIELD OF DISCLOSURE

One or more aspects of this disclosure relate generally to packaging of devices. In particular, one or more aspects of this disclosure relate to fan-out wafer level packaging of devices.

BACKGROUND

In conventional fan-out wafer level packaging (FOWLP), a device (e.g., die, wafer, etc.) is placed on a carrier. Then a mold compound—either granule or liquid—is applied and compression molded. A conventional compression mold packaged device 100 is illustrated in FIG. 1A. The conventional device 100 includes a die 110 encapsulated by a mold compound 150. The device 100 also includes a plurality of metal layers 120 electrically coupling the die 110 with a plurality of solder balls 130. The metal layers 120 are also referred to as redistribution layers (RDL). A polymer dielectric passivation layer 140 is in between the die 110 and the plurality of metal layers 120 other than those portions used to electrically couple the die 110 with the plurality of metal layers 120.

So as to minimize clutter, elements such as under bump metallization (UBM) layers and bonding pads are not specifically illustrated. Also while not shown, the device 100 can be attached to a printed circuit board (PCB) through the plurality of solder balls 130, and the area between the device 100 and the PCB may be filled with adhesive such as filled epoxy also known as an underfill.

In the conventional FOWLP, there can be a step between the die and the surrounding compression molded encapsulant. The hashed circular area of FIG. 1A is magnified in FIG. 1B which shows the step between the bottom surface of the die (active side of die) 110 and the mold compound 150. The step can be as much as 5 μm or greater. The step can act as a stress concentrator (e.g., mechanical and/or thermal stresses), and thus can cause reliability issues to develop.

To address such problems, a 10-15 μm thick polymer layer can be used for passivation and planarized prior to plating the RDLs. Unfortunately, the thick polymer layer can cause warpage issues. There can also be issues related to reliability depending on the type of polymer dielectric passivation used. In addition, the thick polymer layer restricts the size of vias such as the via 145. Typically, the via size to polymer thickness ratio is ≥1. For example, a 14 μm film will have a via size of ≥14 μm.

SUMMARY

This summary identifies features of some example aspects, and is not an exclusive or exhaustive description of the disclosed subject matter. Whether features or aspects are included in, or omitted from this Summary is not intended as indicative of relative importance of such features. Additional features and aspects are described, and will become apparent to persons skilled in the art upon reading the following detailed description and viewing the drawings that form a part thereof.

One or more aspects are direct to a device. The device may comprise a die, a mold compound, a redistribution layer (RDL) and an interconnect. A bottom surface and a top surface of the die may respectively be an active side and a non-active side of the die. The mold compound may encapsulate the die. The mold compound may be above the top surface of the die in a fan-in area and may also be in a fan-out area. The fan-in area may refer to an area of the device that corresponds to a lateral width of the die, and the fan-out area may refer to an area of the device that extends laterally away from a side surface of the die. The mold compound in the fan-in area may not be coplanar with the mold compound in at least a portion of the fan-out area. The redistribution layer may be below the bottom surface of the die and below the mold compound. A portion of the redistribution layer may be in the fan-out area. The interconnect may be below the redistribution layer and electrically coupled to the die through the redistribution layer.

One or more aspects are direct to a method to form a device. The method may include forming a mold compound so as to encapsulate a die. A bottom surface and a top surface of the die may respectively be an active side and a non-active side of the die. The mold compound may be formed above the top surface of the die in a fan-in area and may also be formed in a fan-out area. The fan-in area may refer to an area of the device that corresponds to a lateral width of the die, and the fan-out area may refer to an area of the device that extends laterally away from a side surface of the die. The mold compound formed in the fan-in area may not be coplanar with the mold compound formed in at least a portion of the fan-out area. The method may also include forming a redistribution layer below the bottom surface of the die and below the mold compound. A portion of the redistribution layer may be formed in the fan-out area. The method may further include forming an interconnect below the redistribution layer. The interconnect may be formed to be electrically coupled to the die through the redistribution layer.

One or more aspects are direct to a device. The device may comprise a die and encapsulating means for encapsulating the die. A bottom surface and a top surface of the die may respectively be an active side and a non-active side of the die. The encapsulating means may be above the top surface of the die in a fan-in area and may also be in a fan-out area. The fan-in area may refer to an area of the device that corresponds to a lateral width of the die, and the fan-out area may refer to an area of the device that extends laterally away from a side surface of the die. The encapsulating means in the fan-in area may not be coplanar with the encapsulating means in at least a portion of the fan-out area. The device may also include redistributing means below the bottom surface of the die and below the encapsulating means. A portion of the redistributing means may be in the fan-out area. The device may further comprise interconnecting means below the redistributing means. The interconnecting means may be electrically coupled to the die through the redistributing means.

BRIEF DESCRIPTION OF THE DRAWINGS

The accompanying drawings are presented to aid in the description of embodiments and are provided solely for illustration of the embodiments and not limitation thereof.

DETAILED DESCRIPTION

Examples are disclosed in the following description and related drawings directed to specific embodiments of one or more aspects of the present disclosure. Alternate embodiments may be devised without departing from the scope of the discussion. Additionally, well-known elements will not be described in detail or will be omitted so as not to obscure the relevant details.

The word "exemplary" is used herein to mean "serving as an example, instance, or illustration." Any embodiment described herein as "exemplary" is not necessarily to be construed as preferred or advantageous over other embodiments. Likewise, the term "embodiments" does not require that all embodiments of the disclosed subject matter include the discussed feature, advantage or mode of operation.

The terminology used herein is for the purpose of describing particular embodiments only and is not intended to be limiting. As used herein, the singular forms "a", "an" and "the" are intended to include the plural forms as well, unless the context clearly indicates otherwise. It will be further understood that the terms "comprises", "comprising", "includes" and/or "including", when used herein, specify the presence of stated features, integers, steps, operations, elements, and/or components, but do not preclude the presence or addition of one or more other features, integers, steps, operations, elements, components, and/or groups thereof.

Further, many embodiments are described in terms of sequences of actions to be performed by, for example, elements of a computing device. It will be recognized that various actions described herein can be performed by specific circuits (e.g., application specific integrated circuits (ASICs)), by program instructions being executed by one or more processors, or by a combination of both. Additionally, these sequence of actions described herein can be considered to be embodied entirely within any form of computer readable storage medium having stored therein a corresponding set of computer instructions that upon execution would cause an associated processor to perform the functionality described herein. Thus, the various aspects may be embodied in a number of different forms, all of which have been contemplated to be within the scope of the claimed subject matter. In addition, for each of the embodiments described herein, the corresponding form of any such embodiments may be described herein as, for example, "logic configured to" perform the described action.

Figure 2A:
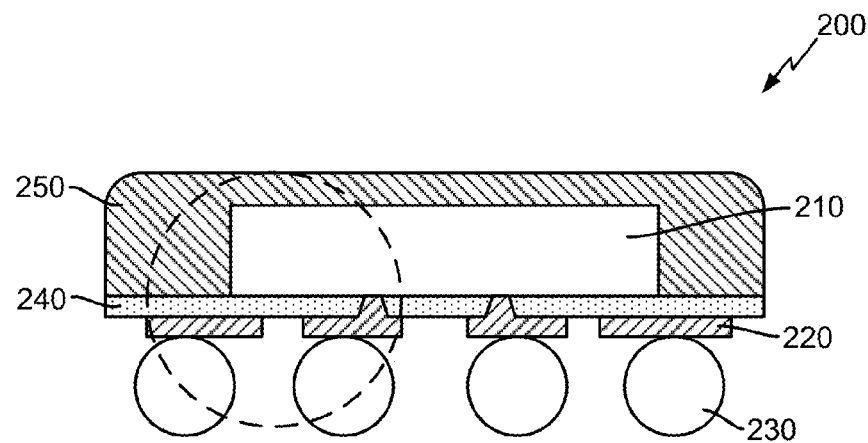
FIG. 2A illustrates an embodiment of a device.
Figure 2B:
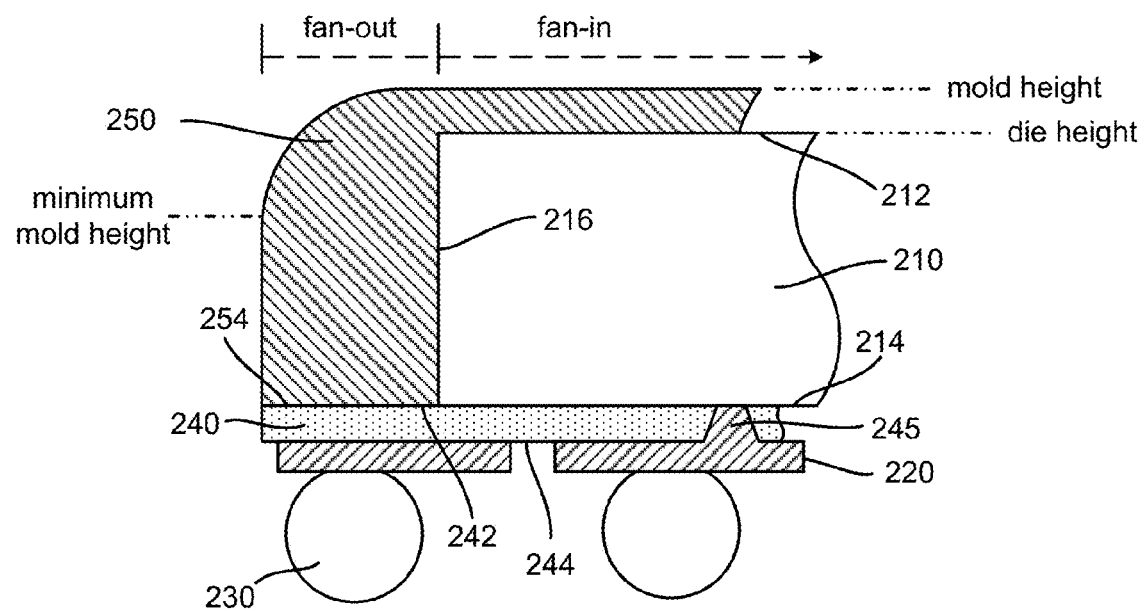
FIG. 2B illustrates a magnification of a portion of FIG. 2A showing a lack of a step between a die and a polymer dielectric passivation layer of the example device embodiment.

In one or more aspects, a laminate sheet mold compound is used rather than compression mold compound to package a die (e.g., a semiconductor die) in a device. In this way, the step between the die and the mold compound can be significantly reduced or eliminated altogether. In other words, the step can be minimized. FIG. 2A illustrates a device 200 according to an aspect, and FIG. 2B represents a magnification of the hashed circular area of FIG. 2A. As seen in both figures, the device 200 may comprise a die 210 and a mold compound 250 which may encapsulate the die 210. The mold compound 250 may be above a top surface 212 of the die 210. The top surface 212 of the die 210 may be the non-active side, also referred to as the backside, of the die 210. In these figures, the mold compound 250, which is an example of an encapsulating means, is shown as being directly on the top surface 212 of the die 210. For simplicity and ease of description, the term "fan-in area" will be used to refer to an area of the device 200 that corresponds to a lateral width of the die 210 (see FIG. 2B). Then it may be said that the mold compound 250 may be above the top surface 212, i.e., above the backside or the non-active side, of the die 210 in the fan-in area. The mold compound 250 may also be in an area of the device 200 that extends laterally away from a side surface 216 of the die 210. The term "fan-out area" will be used to refer to this lateral area (also see FIG. 2B).

Note that the terms "fan-in" and "fan-out" should not be taken in a limiting sense. The terms are for convenience and are used to refer to different areas of the device. Unless specifically indicated otherwise, the terms should not be taken to limit the device to fan-in/fan-out package types. Similarly, the terms such as "top", "bottom", "upper", "lower", etc. also should not be taken in a limiting sense, i.e., they should not be taken to refer to absolute positioning unless otherwise specifically indicated.

Figure 1A:
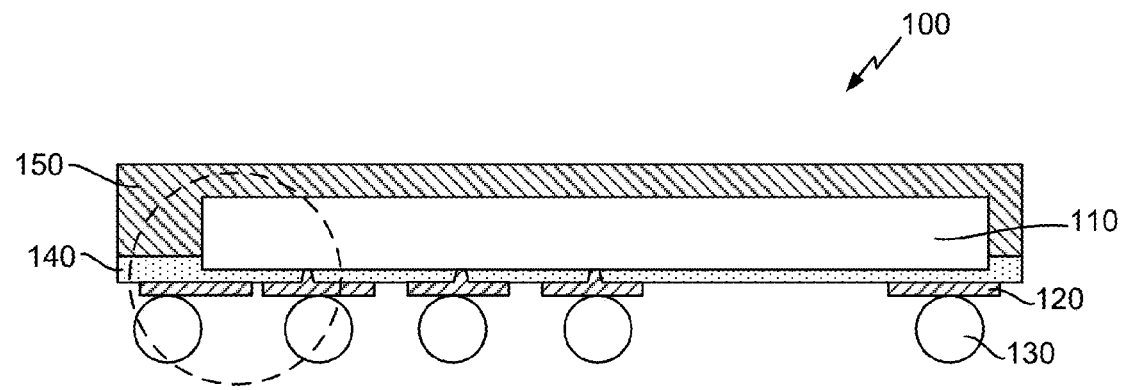
FIG. 1A illustrates a conventional compression mold packaged device.

In an aspect, a height of the mold compound 250 of the device 200 need not be uniform. For example, the height of the mold compound 250 above the top surface 212 of the die 210 in the fan-in area can be different from the height of the mold compound 250 in the fan-out area. This is different from the conventional device 100 illustrated in FIGS. 1A and 1B in which the height of the mold compound 150 is uniform along the entire width of the device 100.

In contrast, the height of the mold compound 250 need not be uniform along the entire width of the device 200 as seen in FIGS. 2A and 2B. In this particular instance, the height of the mold compound 250 is shown to decrease within the fan-out area corresponding generally to a distance away from the side surface 216 of the die 210. That is, in an aspect, a minimum height of the mold compound 250 in the fan-out area may be lower than the height of the mold compound 250 in the fan-in area. In FIG. 2B, the minimum height is illustrated as being lower than the height of the die 210. However, this is not a limitation. The minimum height of the mold compound 250 in the fan-out area can be higher than the height of the die 210 (not shown) in an aspect, and can be equal to (or substantially equal to) the height of the die 210 (not shown) in another aspect.

It is not required that the height of the mold compound 250 in all of the fan-out area be different from the height of the mold compound 250 in the fan-in area. The height of the mold compound 250 in some part of the fan-out area can be the same as the fan-in area. In other words, the mold compound 250 of the fan-in area may be non-coplanar with the mold compound 250 of at least a portion of the fan-out area.

Figure 1B:
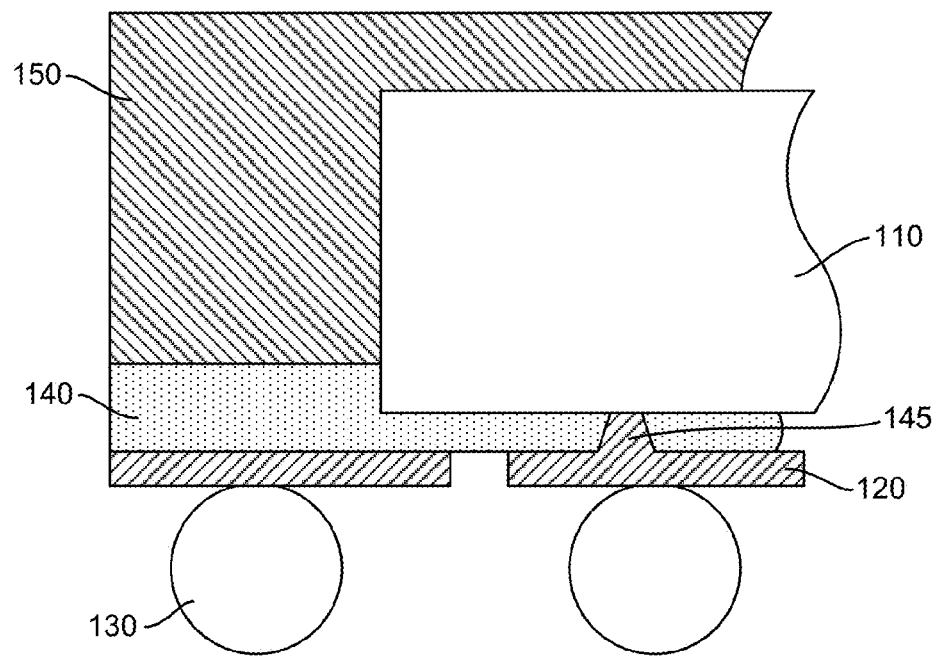
FIG. 1B illustrates a magnification of a portion of FIG. 1A showing a step between a die and a polymer dielectric passivation layer of the conventional device.

Recall that one of the problems associated with the conventional device 100 is the step between the die 110 and the mold compound 150 (see FIG. 1B). However, in one or more aspects, the step can be minimized, i.e., eliminated or at least significantly reduced (e.g., less than 5 μm). For example, in FIG. 2B, the bottom surface 254 of the mold compound 250 in the fan-out area is shown to be coplanar or substantially coplanar with the bottom surface 214 of the die 210. When the step is minimized, the corresponding stresses (e.g., thermal and/or mechanical) can be minimized. In turn, reliability may be enhanced.

The device 200 may also comprise a redistribution layer (RDL) 220 below the die 210 and below the mold compound 250. In this example, the redistribution layer 220, which is an example of a redistributing means, is illustrated as being below the bottom surface 214 of the die 210. The bottom surface 214 of the die 210 may be the active side, also referred to as the frontside, of the die 210. The redistribution layer 220 may be electrically conductive and form an electrical path (e.g., for input/output signals, power and/or ground) between the die 210 and an interconnect 230 (explained further below). The redistribution layer 220 may be formed from electrically conductive materials including metals such as copper (Cu), nickel (Ni), nickel vanadium (NiVd), and titanium copper (TiCu). A portion of the redistribution layer 220 may be laterally outside of the die 210. To state it another way, a portion of the redistribution layer 220 may be in the fan-out area. The redistribution layer 220 may be in direct contact with the die 210.

The device 200 may further comprise an interconnect 230 below the redistribution layer 220. The interconnect 230, which may comprise a solder ball, Cu pillar, or other metallurgical interconnect such as silver paste, may be electrically coupled to the die 210 through the redistribution layer 220. For example, the interconnect 230, which is an example of an interconnecting means, may be in direct contact with the redistribution layer 220. In particular, the interconnect 230 may make contact with the portion of the redistribution layer 220 in the fan-out area. Note that in an aspect, at least a portion of the interconnect 230 may be in the fan-out area.

In addition, the device 200 may comprise a polymer dielectric passivation layer 240 which may be formed from polyimide materials. The polymer dielectric passivation layer 240, which is an example of a passivation means, may be below the mold compound 250 and/or the die 210. For example, the mold compound 250 and/or the die 210 may be in contact with an upper surface 242 of the polymer dielectric passivation layer 240. The polymer dielectric passivation layer 240 may also be above the redistribution layer 220. For example, the redistribution layer 220 may be in contact with a lower upper surface 244 of the polymer dielectric passivation layer 240 (see FIGS. 2A and 2B). The polymer dielectric passivation layer 240 may comprise a via 245 through which the redistribution layer 220 may couple electrically with the die 210. Note that the via 245 may be tapered.

Recall also that another of the problems associated with the conventional device 100 is that a very thick polymer is used for the passivation layer. The thick polymer dielectric passivation layer 140 causes warpage issues and restricts the size of the vias. However, in one or more aspects, the polymer dielectric passivation layer 240 can be made to be very thin such as 1.8 µm or less. With the thin polymer dielectric passivation layer 240, warpage can be significantly reduced. Also, with the thin polymer dielectric passivation layer 240, the size of the via 245 can be made small such as 2 µm or smaller. This can allow for better and/or more flexible routability of the redistribution layer 220. While not shown, the device 200 can be attached to a printed circuit board (PCB) through one or more of the interconnect 130s (e.g., solder balls). The area between the device 200 and the PCB may be filled with one or more dielectric layers.

Figure 3A:
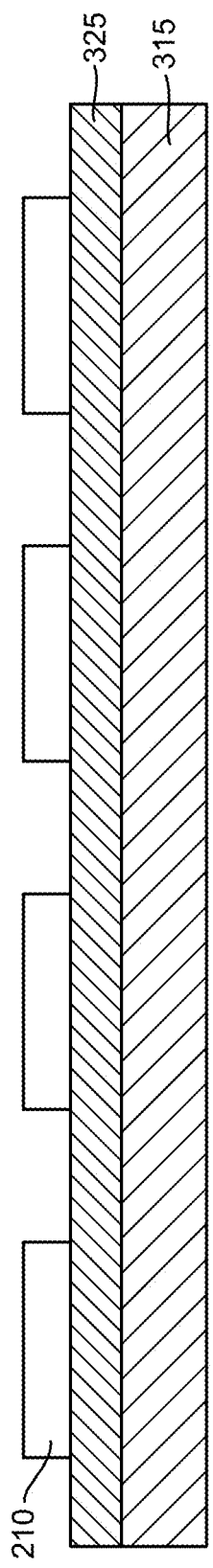
FIGS. 3A-3F illustrate various fabrication stages of an example process to manufacture a device.

FIGS. 3A-3F illustrate various fabrication stages of an example process to manufacture a device. The illustrated stages may be related to the manufacture of the device 200 illustrated in FIGS. 2A and 2B. FIG. 3A illustrates a stage in which one or more dies 210 may be placed on a first carrier 315 with a first adhesive 325.

Figure 3B:
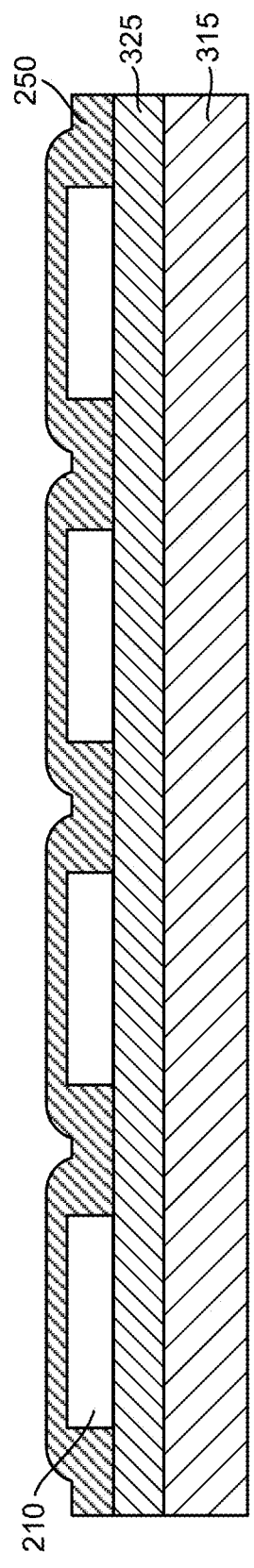

FIG. 3B illustrates a stage in which the mold compound 250, which may be a sheet mold compound such as an epoxy sheet, may be placed on top of the dies 210 and the first carrier 315 and laminated. In this way, the die 210 may be encapsulated on its top and side surfaces 212, 216. Note that the topology of the mold compound 250 can be very different from the topology of the mold compound 150 of the conventional device 100. As indicated above, the mold compound 250 need not be coplanar throughout its entire width.

Using a laminate mold compound (e.g., epoxy sheet) rather than a compression mold compound (e.g., liquid, granules) can be advantageous. The mold compound 250 can be effective in minimizing the step between the die 210 and the mold compound 250. One reason for the step being minimized is due to the relatively low pressure during lamination of the sheet mold compound compared to conventional methods such as compression molding. Thus, lower forces can advantageously result in less pressure being exerted on the dies 210 during molding. This in turn can result in less pressure pushing the die 210 in to the first adhesive 325, which is relatively compliant and pressure sensitive. In addition to minimizing the step, laminating the mold compound 250 on the dies 210 can minimize (reduce or eliminate) die movement during lamination and/or minimize reliability risk when compared to conventional methods.

Another advantage is that the mold compound 250 can be thinly applied (e.g., as thin as 75 µm or less) relative to the conventional mold compound 150 (thickness of which can range from 400-600 µm or even greater). Normally, lamination involves a thin die (e.g., 50 µm) and a thick mold compound (e.g., 100 µm). But in an aspect, structures with thick dies (e.g., 200 µm or thicker) and thin mold compound (e.g., 75 µm or thinner) are possible.

Figure 3C:
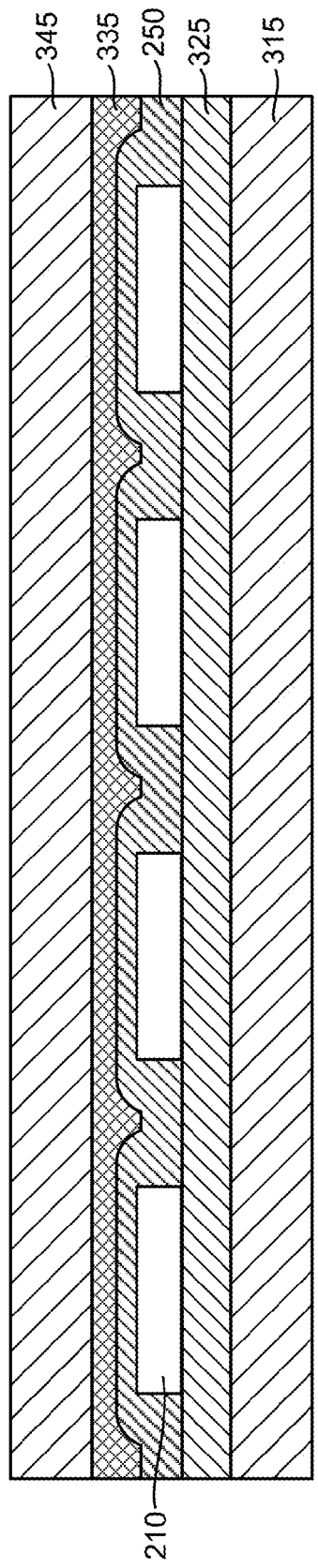

FIG. 3C illustrates a stage in which a second carrier 345 with a second adhesive 335 may be attached to the mold compound 250. Preferably, the second adhesive 335 is compliant so that it can conform to the topology of the mold compound 250. But in another aspect, the topology of the mold compound 250 may also be controlled through tailoring the properties of the mold compound 250 and/or the second adhesive 335. These properties may include any one or more of the rheology of the mold compound 250, the compliance of the second adhesive 335, and the thickness of the second adhesive 335. Being able to control the topology can enhance reliability of the device 200.

Figure 3D:
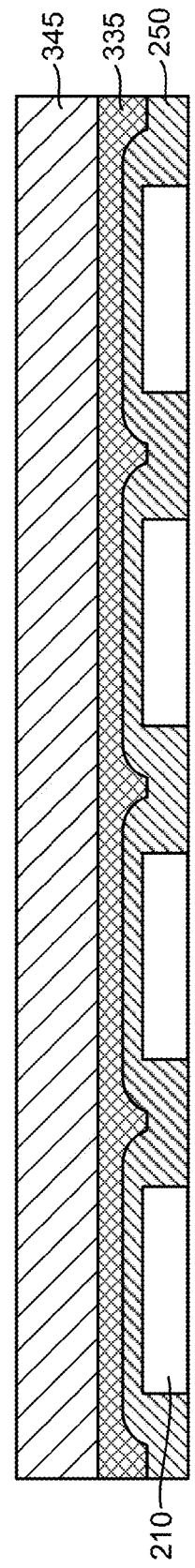
Figure 3E:
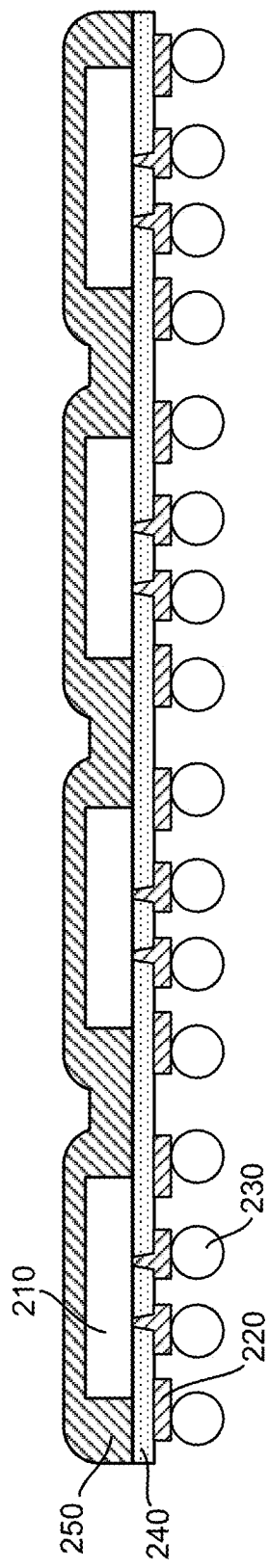
Figure 3F:
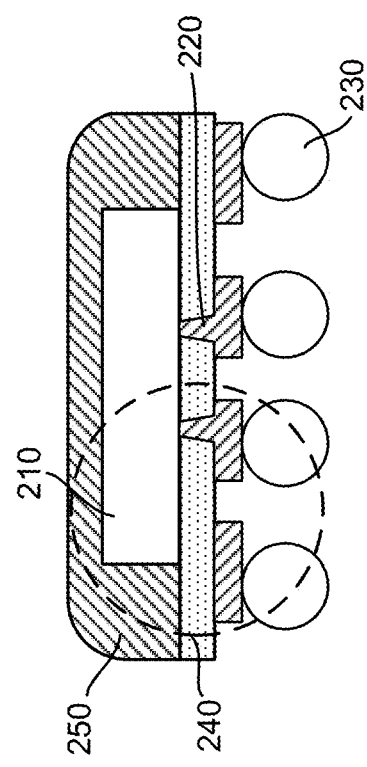

FIG. 3D illustrates a stage in which the first carrier 315 and the first adhesive 325 may be removed. FIG. 3E illustrates a stage that results from building of the redistribution layers 220, attaching of the interconnects 230, followed by removing the second carrier 345 and the second adhesive 335. For example, a first polymer may be coated, exposed, and developed to form the polymer dielectric passivation layer 240. Then a metal layer (e.g., Cu layer) may be sputtered and etched to form the redistribution layer 220. Thereafter, the interconnects 230 may be attached and the second carrier 345 and the second adhesive 335 may be removed. FIG. 3F illustrates a singulation stage.

Figure 4:
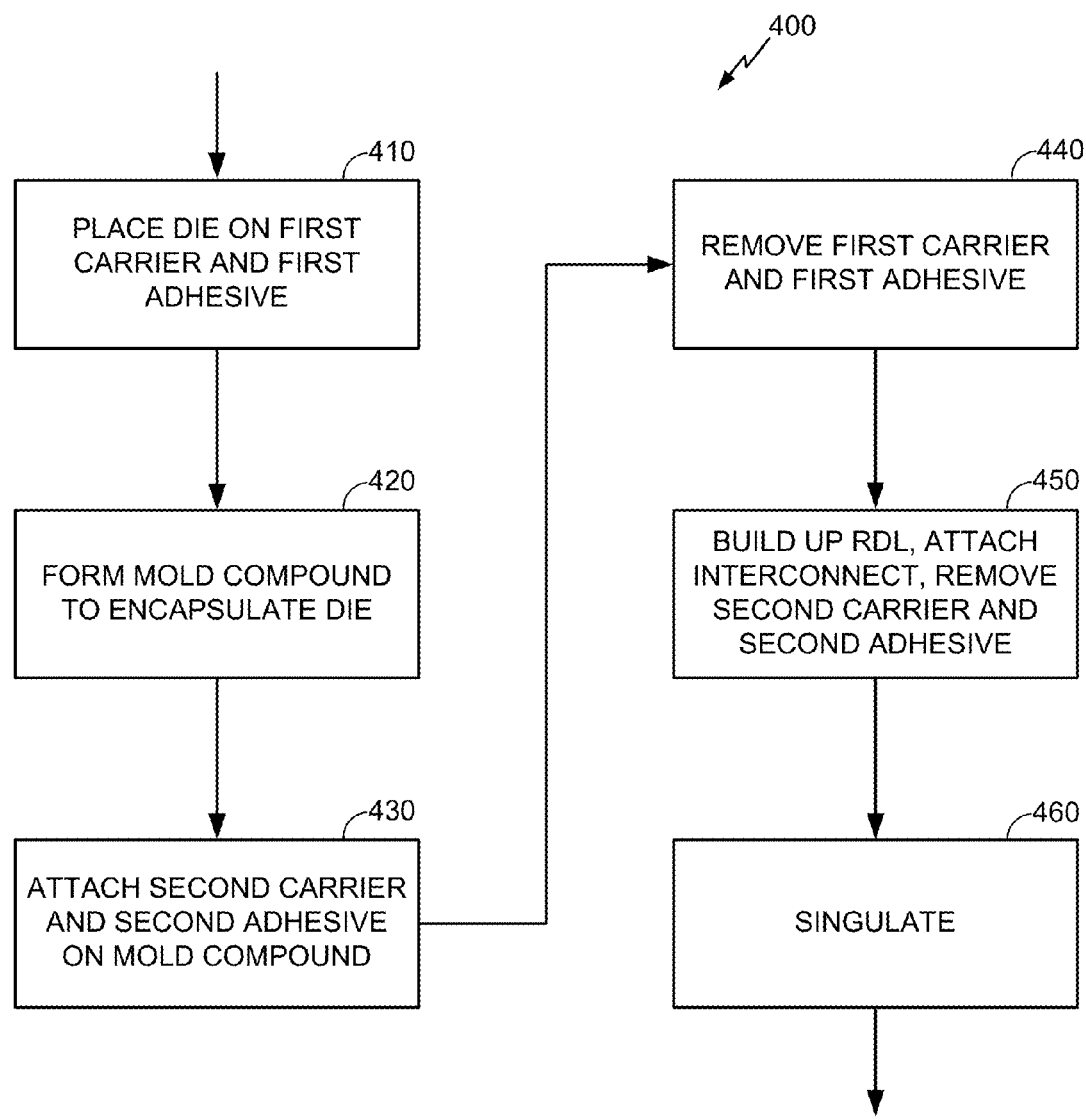
FIG. 4 illustrates a flow chart of an example method to manufacture a device.

FIG. 4 illustrates a flow chart of an example method 400 to manufacture a device such as the device 200 of FIGS. 2A and 2B. In block 410, the die 210 may be placed on the first carrier 315 and the first adhesive 325 (see FIG. 3A). In block 420, the mold compound 250 may be formed so as to encapsulate the die 210 (see FIG. 3B). In block 430, the second carrier 345 and the second adhesive 335 may be attached to the mold compound 250 (see FIG. 3C). In block 440, the first carrier 315 and the first adhesive 325 may be removed (see FIG. 3D). In block 450, the redistribution layer 220 may be built-up, the interconnect 230 may be attached, and the second carrier 345 and the second adhesive 335 may be removed (see FIG. 3E). In block 460, the device 200 may be singulated.

Figure 5:
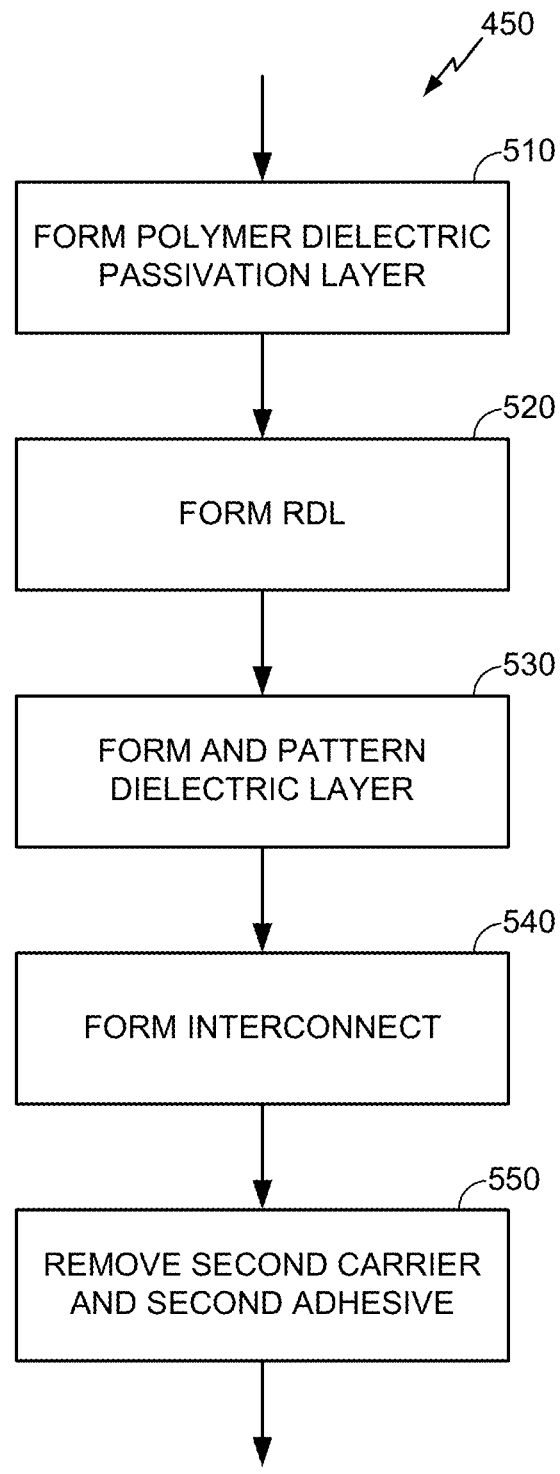
FIG. 5 illustrates a flow chart of an example process to build-up a redistribution layer, attach interconnects, and remove a carrier.

FIG. 5 illustrates a flow chart of an example process to perform block 450 of the method 400. In block 510, the polymer dielectric passivation layer 240 may be formed below the mold compound 250 and/or the die 210. For example, polyimide materials may be used. The polymer dielectric passivation layer 240 may be formed with the via 245. In block 520, the redistribution layer 220 may be formed from conductive metals such as Cu. The redistribution layer 220 may electrically couple with the die 210 through the via 245. In block 530, a dielectric layer may be formed below the redistribution layer 220. The dielectric layer, which may be formed from the same material(s) as the polymer dielectric passivation layer 240, may be patterned so as to expose a portion of the redistribution layer 220. In block 540, the interconnect 230 maybe formed to electrically couple with redistribution layer 220 through the exposed portion of the dielectric layer. In block 550, the second carrier 345 and the second adhesive 335 may be removed.

Figure 6:
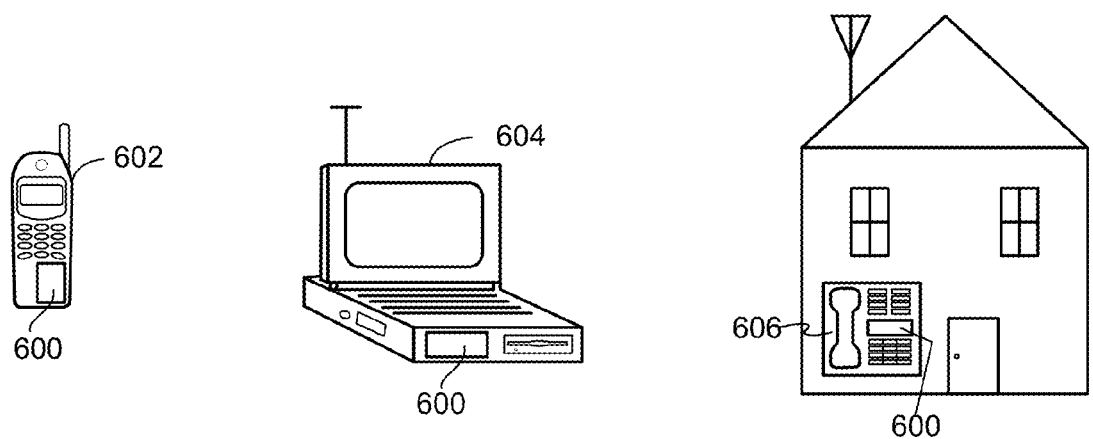
FIG. 6 illustrates examples of apparatuses with a device integrated therein.

FIG. 6 illustrates various electronic devices that may be integrated with any of the aforementioned device. For example, a mobile phone device 602, a laptop computer device 604, and a fixed location terminal device 606 may include a device 600 as described herein. The device 600 may be, for example, any of the integrated circuits, dies, integrated devices, integrated device packages, integrated circuit devices, device packages, integrated circuit (IC) packages, package-on-package devices described herein. The devices 602, 604, 606 illustrated in FIG. 6 are merely exemplary. Other electronic devices may also feature the device 600 including, but not limited to, a group of devices (e.g., electronic devices) that includes mobile devices, handheld personal communication systems (PCS) units, portable data units such as personal digital assistants, global positioning system (GPS) enabled devices, navigation devices, set top boxes, music players, video players, entertainment units, fixed location data units such as meter reading equipment, communications devices, smartphones, tablet computers, computers, wearable devices, servers, routers, electronic devices implemented in automotive vehicles (e.g., autonomous vehicles), or any other device that stores or retrieves data or computer instructions, or any combination thereof.

One or more of the components, steps, features, and/or functions illustrated in FIGS. 3A-3F, 4 and 5 may be rearranged and/or combined into a single component, step, feature or function or embodied in several components, steps, or functions. Additional elements, components, steps, and/or functions may also be added without departing from the scope of the disclosure.

Those of skill in the art will appreciate that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Further, those of skill in the art will appreciate that the various illustrative logical blocks, modules, circuits, and algorithms described in connection with the embodiments disclosed herein may be implemented as electronic hardware, computer software, or combinations of both. To clearly illustrate this interchangeability of hardware and software, various illustrative components, blocks, modules, circuits, and methods have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present disclosure.

The methods, sequences and/or algorithms described in connection with the embodiments disclosed herein may be embodied directly in hardware, in a software module executed by a processor, or in a combination of the two. A software module may reside in RAM memory, flash memory, ROM memory, EPROM memory, EEPROM memory, registers, hard disk, a removable disk, a CD-ROM, or any other form of storage medium known in the art. An exemplary storage medium is coupled to the processor such that the processor can read information from, and write information to, the storage medium. In the alternative, the storage medium may be integral to the processor.

Accordingly, an embodiment can include a computer readable media embodying a method of forming a device. Accordingly, the scope of the disclosed subject matter is not limited to illustrated examples and any means for performing the functionality described herein are included.

While the foregoing disclosure shows illustrative embodiments, it should be noted that various changes and modifications could be made herein without departing from the scope of the disclosed subject matter as defined by the appended claims. The functions, processes and/or actions of the method claims in accordance with the embodiments of the disclosed subject matter described herein need not be performed in any particular order. Furthermore, although elements of the disclosed subject matter may be described or claimed in the singular, the plural is contemplated unless limitation to the singular is explicitly stated.

What is claimed is:

1. A device, comprising:
   a die, wherein a bottom surface and a top surface of the die are respectively an active side and a non-active side of the die;
   a mold compound encapsulating the die;
   a redistribution layer (RDL) below the bottom surface of the die and below the mold compound; and
   an interconnect below the redistribution layer and electrically coupled to the die through the redistribution layer,
   wherein the mold compound is above the top surface of the die in a fan-in area and is also in a fan-out area, the fan-in area referring to an area of the device that corresponds to a lateral width of the die, and the fan-out area referring to an area of the device that extends laterally away from a side surface of the die,
   wherein the mold compound in the fan-in area is not coplanar with the mold compound in at least a portion of the fan-out area,
   wherein a portion of the redistribution layer is in the fan-out area, and wherein the redistribution layer is in direct contact with the die.

2. The device of claim 1, wherein the interconnect is in direct contact with the redistribution layer.

3. The device of claim 2, wherein the interconnect is in direct contact with the portion of the redistribution layer in the fan-out area.

4. The device of claim 1, wherein the interconnect comprises any one or more of a solder ball, a copper (Cu) pillar, and silver paste.

5. The device of claim 1,
wherein a minimum height of the mold compound in the fan-out area is lower than a height of the mold compound in the fan-in area, and
wherein the minimum height is a lowest height of a top surface of the mold compound.

6. The device of claim 5, wherein the minimum height of the mold compound in the fan-out area is higher than a height of the die.

7. The device of claim 5, wherein the minimum height of the mold compound in the fan-out area is substantially equal to or lower than a height of the die.

8. The device of claim 1, wherein a bottom surface of the mold compound in the fan-out area is substantially coplanar with the bottom surface of the die.

9. The device of claim 1, further comprising a polymer dielectric passivation layer,
wherein both the mold compound and the die contact an upper surface of the polymer dielectric passivation layer, and
wherein the redistribution layer contacts a lower surface of the polymer dielectric passivation layer.

10. The device of claim 1, wherein the device is incorporated into a device selected from a group consisting of a music player, a video player, an entertainment unit, a navigation device, a communications device, a mobile device, a mobile phone, a smartphone, a personal digital assistant, a fixed location terminal, a tablet computer, a computer, a wearable device, a laptop computer, a server, and a device in an automotive vehicle.

11. A method to form a device, the method comprising:
forming a mold compound so as to encapsulate a die, wherein a bottom surface and a top surface of the die are respectively an active side and a non-active side of the die;
forming a redistribution layer (RDL) below the bottom surface of the die and below the mold compound;
forming an interconnect below the redistribution layer such that the interconnect is electrically coupled to the die through the redistribution layer;
placing the die on a first carrier with a first adhesive prior to forming the mold compound;
removing the first carrier and the first adhesive from the die subsequent to forming the mold compound and prior to forming the redistribution layer; and
attaching a second carrier with a second adhesive on the mold compound subsequent to forming the mold compound,
wherein forming the mold compound comprises forming the mold compound above the top surface of the die in a fan-in area and in a fan-out area, the fan-in area referring to an area of the device that corresponds to a lateral width of the die, and the fan-out area referring to an area of the device that extends laterally away from a side surface of the die,
wherein the mold compound formed in the fan-in area is not coplanar with the mold compound formed in at least a portion of the fan-out area, and
wherein forming the redistribution layer comprises forming a portion of the redistribution layer in the fan-out area.

12. The method of claim 11, wherein forming the mold compound comprises laminating the die with a sheet mold compound.

13. The method of claim 11, further comprising tailoring one or more properties of the mold compound to control a topology of the mold compound.

14. The method of claim 11, wherein forming the interconnect comprises forming at least a portion of the interconnect in the fan-out area.

15. The method of claim 11,
wherein forming the mold compound comprises forming the mold compound such that a minimum height of the mold compound in the fan-out area is lower than a height of the mold compound above the top surface of the die, and
wherein the minimum height is a lowest height of a top surface of the mold compound.

16. The method of claim 11, wherein forming the mold compound comprises forming the mold compound such that a bottom surface of the mold compound in the fan-out area is substantially coplanar with the bottom surface of the die.

17. The method of claim 11, further comprising forming a polymer dielectric passivation layer such that the mold compound and the die contact an upper surface of the polymer dielectric passivation layer, and the redistribution layer contacts a lower surface of the polymer dielectric passivation layer.

18. A device, comprising:
a die, wherein a bottom surface and a top surface of the die are respectively an active side and a non-active side of the die;
encapsulating means for encapsulating the die;
redistributing means below the bottom surface of the die and below the encapsulating means; and
interconnecting means below the redistributing means and electrically coupled to the die through the redistributing means,
wherein the encapsulating means is above the top surface of the die in a fan-in area and is also in a fan-out area, the fan-in area referring to an area of the device that corresponds to a lateral width of the die, and the fan-out area referring to an area of the device that extends laterally away from a side surface of the die,
wherein the encapsulating means in the fan-in area is not coplanar with the encapsulating means in at least a portion of the fan-out area,
wherein a portion of the redistributing means is in the fan-out area, and
wherein the redistributing means is in direct contact with the die.

19. The method of claim 15, wherein forming the mold compound comprises forming the mold compound such that the minimum height of the mold compound in the fan-out area is higher than a height of the die.

20. The device of claim 18,
wherein a minimum height of the encapsulating means in the fan-out area is lower than a height of the encapsulating means in the fan-in area,
wherein the minimum height of the encapsulating means in the fan-out area is higher than a height of the die, and wherein the minimum height is a lowest height of a top surface of the encapsulating means.

21. The device of claim 1, wherein there are no conductors within the mold compound in the fan-out area.

22. The method of claim 11, wherein no conductors are formed within the mold compound in the fan-out area.

23. The device of claim 18, wherein there are no conductors within the encapsulating means in the fan-out area.

* * * * *